United States Patent
Lochmahr et al.

[19]

[11] Patent Number: 6,111,330
[45] Date of Patent: Aug. 29, 2000

[54] ARRANGEMENT FOR SENSING THE TEMPERATURE OF THE ARMATURE OF A DIRECT CURRENT MOTOR

[75] Inventors: Gunnar Lochmahr, Leonberg; Volker Aab, Lichtenau-Ulm; Gerhard Knecht, Iffezheim, all of Germany

[73] Assignee: Robert Bosch GmbH, Stuttgart, Germany

[21] Appl. No.: 09/043,718

[22] PCT Filed: Jun. 10, 1997

[86] PCT No.: PCT/DE97/01166

§ 371 Date: May 27, 1998

§ 102(e) Date: May 27, 1998

[87] PCT Pub. No.: WO98/04893

PCT Pub. Date: Feb. 5, 1998

[30] Foreign Application Priority Data

Jul. 25, 1996 [DE] Germany ............... 196 30 027

[51] Int. Cl.[7] .................................................. H02K 11/00
[52] U.S. Cl. ................... 310/68 C; 310/68 B; 310/68 D; 310/68 R; 310/68 A
[58] Field of Search ................. 310/68 R, 68 B, 310/68 C, 68 D; 318/138, 254, 439

[56] References Cited

U.S. PATENT DOCUMENTS

| | | | |
|---|---|---|---|
| 5,281,919 | 1/1994 | Palanisamy | 324/427 |
| 5,291,115 | 3/1994 | Ehsani | 318/701 |
| 5,497,218 | 3/1996 | Amico | 355/208 |
| 5,583,404 | 12/1996 | Karwath et al. | 318/254 |
| 5,672,948 | 9/1997 | Cohen et al. | 318/603 |
| 5,717,297 | 2/1998 | Karwath et al. | 318/254 |

*Primary Examiner*—Elvin Enad
*Attorney, Agent, or Firm*—Kenyon & Kenyon

[57] ABSTRACT

An arrangement for the determination of the temperature of a direct-current motor. The temperature is determined in an indirect manner from the temperature-dependent armature resistance, with the armature resistance being determined as the quotient of the voltage being applied to and measured at the motor terminals and of the blocking current of the armature, and being set in relation to the respective temperature. The current signal determined from the current flowing within the armature is averaged with adjustable, calculated integration times with the aid of an integrator that can be controlled by a microcontroller. The arrangement, can be used for the indirect determination of the rpm rate (N) and/or variations that are critical or of interest in the rpm rate of the motor. The rpm rate is proportional to the voltage ($U_{ind}$) induced within the armature, taking into consideration a motor-typical proportionality constant ($\kappa$) according to equation $N=\kappa \, U_{ind}$, with the voltage induced within the armature being determined as the difference between the voltage being applied to the motor terminals and the product of armature current and armature resistance.

13 Claims, 1 Drawing Sheet

ARRANGEMENT FOR SENSING THE TEMPERATURE OF THE ARMATURE OF A DIRECT CURRENT MOTOR

BACKGROUND INFORMATION

A safety circuit is described in U.S. Pat. No. 4,307,325 for a direct current motor, which is used, in particular as a drive motor for tools. The motor is protected against excess temperature by estimating the motor temperature on the basis of a calculation. The calculation takes into consideration both the rpm rate as well as the motor current or the current conduction flow angle of a phase segment control.

SUMMARY OF THE INVENTION

According to the present invention, in order to detect the temperature of the armature of a direct current motor, the temperature is detected in an indirect manner from the temperature-dependent armature resistance, the armature resistance being determined as the quotient of the voltage being applied to and measured at the motor terminals and the respective temperature.

According to the present invention, the blocking current is determined by extrapolation of the armature current determined at a specific point in time.

The present invention provides for the measurement, and where necessary, for the amplification of the current flowing into the armature via a shunt resistor, and for the digitization of the current into a current signal via an analog-digital converter.

According to the present invention, the current signal determined from the current flowing in the armature is averaged with adjustable, calculated integration times with the aid of an integrator controlled by a microcontroller.

According to the present invention, the current signal determined from the current flowing in the armature is integrated over numerous commutation periods.

The present invention provides that the integration of the current signal determined from the current flowing in the armature is interrupted when a threshold value is exceeded, the determined value is digitized and stored, integration begins anew with this process continuing until the entire adjusted and intended integration time has elapsed.

The present invention can be very practically used for the indirect determination of the rpm rate of a motor and/or variations that are critical or of interest in the rpm rate of a motor.

According to the present invention the rpm rate is proportional to the voltage induced in the armature in accordance with equation $N = \kappa \cdot U_{ind}$, taking into consideration a motor-typical proportionality constant with the voltage induced in the armature being determined as the difference between the voltage applied at the motor terminals and the product of the armature voltage by the armature resistance.

DETAILED DESCRIPTION

In accordance with the present invention, the temperature in a direct current motor or in the armature of a direct current motor is determined in an indirect manner. The temperature is determined in an indirect manner from the temperature-dependent armature resistance $R_A$. The armature resistance $R_A$ itself is determined as the quotient of the measurable voltage $U_{kl}$ applied to the terminals of the motor, which, when connected to a battery, especially a vehicle battery, corresponds to battery voltage $U_{bat}$, and the blocking current $I_{block}$ of the armature, and set in relation to the respective temperature. In the following description, the generally known relationship of measured resistance and associated temperature is not dealt with in greater detail.

Figure 1:
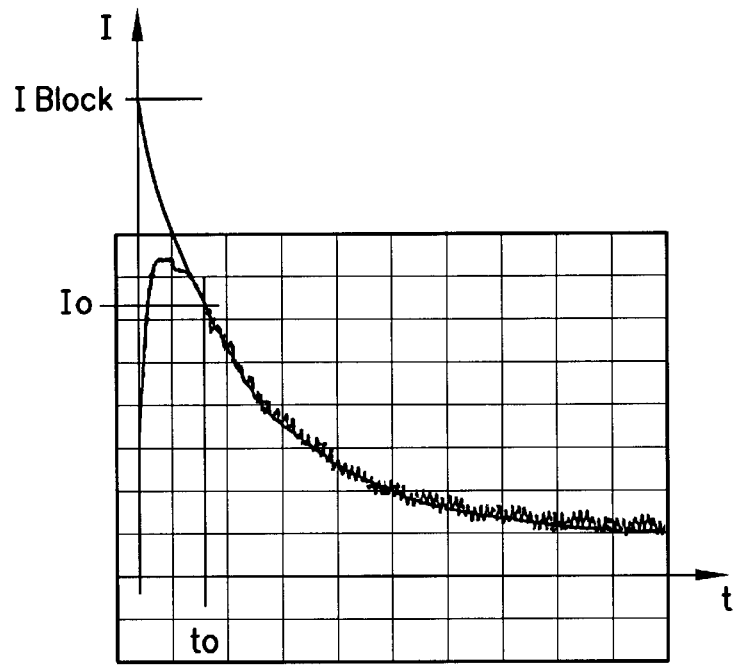
FIG. 1 shows a typical variation of the motor current together with superimposed commutation fluctuations.

FIG. 1 shows the typical variation of motor current I together with superimposed fluctuations in commutation plotted against time axis t. The armature current is limited by armature inductivity. Consequently, blocking current $I_{block}$ does not flow at the instant of switch-on, but instead there occurs an exponentially increasing armature current having an electric time constant of $\tau_{electric}$ which is considerably less than $\tau_{mech}$. Peak starting current does not reach the level of full blocking current $I_{block}$, since the armature of the motor has already begun to turn while the electrical time constant $\tau_{electric}$ elapses. The ratio of blocking current to peak starting current depends only upon the two time constants $\tau_{mech}$ and $\tau_{electric}$ and is thus constant.

Armature resistance $R_A$ is determined at any desired and suitable point in time and for purposes of comparison at the beginning of each start of the motor from terminal voltage $U_{kl}$ applied to the motor or $U_{bat}$ when a battery is used as a voltage source and from blocking current $I_{block}$ at moment to after the start, on the basis of the equation $R_A = U_{kl}/I_{block}$.

As shown in the representation of motor current in FIG. 1, fluctuations in commutation are superimposed over the actual exponentially varying motor current $I_A$ or the resulting motor current signal. In many applications, the amplitude of these so-called ripples, lies within a range corresponding to variations of signal which are of interest. For this reason these commutation ripples must in such instances be eliminated. In accordance with the present invention, the current signal is averaged to this end over a suitable number of commutation ripples over the course of a given period of time.

Figure 2:
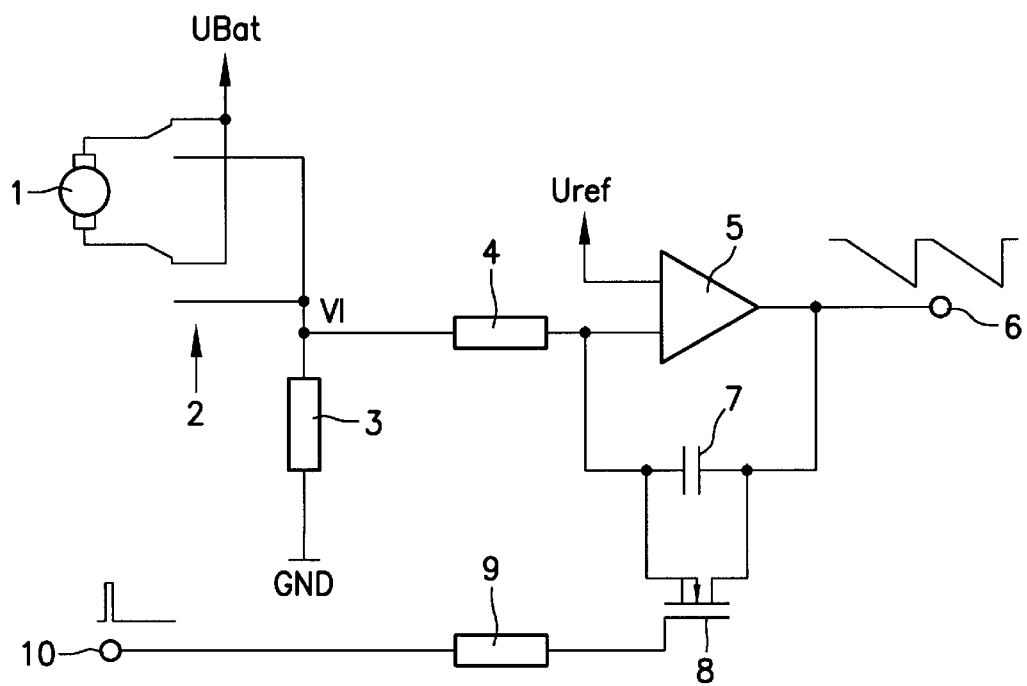
FIG. 2 shows an exemplary block diagram of the arrangement according to invention.

In the schematic block diagram of an exemplary arrangement according to the present invention shown in FIG. 2, a direct current motor 1 is shown which is either connected, via a dual relay 2, to voltage $U_{bat}$ of a vehicle battery (not shown) which, in the example shown, represents the terminal voltage $U_{kl}$ applied to the motor terminals, or to a shunt in order to measure the motor current at measuring resistor 3. One side of shunt 3 is applied to a ground potential GND, while the other terminal is connected via a resistor 4 to the inverting input of an operational amplifier 5. The measured armature current value of motor 1 which is tapped at shunt 3 and converted into current signal V1 is thus amplified. Output 6 of operational amplifier 5 is fed back to its inverting input via capacitor 7. Thus operational amplifier 5, together with capacitor 7, constitutes an integrator. A reference voltage $U_{ref}$ is applied to the non-inverting input of operational amplifier 5, with the reference voltage being so selected as to always be greater than the maximum amplitude of current signal V1 which corresponds to blocking current $I_{block}$. Capacitor 7 can be bridged by a transistor 8, in particular a MOSFET. Transistor 8 is controlled from input 10 by a turn-off pulse via a resistor 9, thus allowing the controlled short-circuiting and discharging of capacitor 7 upon the occurrence of the turn-off pulse. The initial condition for integration is determined again and integration can begin anew.

The integrated and amplified current signal V1 arising at output 6 of operational amplifier 5 is fed to an analogdigital-converter for analysis (not shown) as well as to a microcontroller (also not shown) for analysis. The microcontroller typically generates the turn-off pulse fed to input 10 for controlling the integration. With each fed turn-off pulse, capacitor 7 is discharged, thus making possible the immediate subsequent increase in voltage at output 6 and at capacitor 7. Integration is continued as long as determined by the microcontroller. Control is achieved by interrupting integration when a specific voltage value is reached and by adding the respective digitized elapsed values until a given voltage value of the integrator is reached at the end of an elapsed predetermined integration time.

Generally it can be seen that the integration time constant of the integrator, basically formed by operational amplifier 5 and capacitor 7, is adjusted so that with the no-load speed of motor 1 the modulation range of the integrator is almost completely used. At lower rpm rates the integration time constant is greater as is armature current and thus the voltage signal to be integrated. In order to avoid associated overmodulation, integration, as previously explained above, is interrupted when a specific threshold value is reached. At this moment the voltage value is digitized via the analog-digital converter and the elapsed integration time is subtracted from the overall integration time adjusted to the rpm rate. From this point on, capacitor 7 is discharged via the turn-off pulse delivered via input 10 of the microcontroller via transistor 8 which is conductively switched for approximately 1 ms. This procedure is continued until the overall integration time has elapsed, with the last integration being interrupted, as previously explained above, due to the elapsed integration time instead of due to the voltage level being exceeded at the output of the integrator.

The above-described arrangement is suitable for the indirect determination of the instantaneous rpm rate N of motor 1, thus making it possible to indirectly determine additional or alternative variations in the rpm rate N of motor 1 that are critical or otherwise of interest. The voltage $U_{ind}$ induced in the armature is one measure of rpm rate N. This voltage $U_{ind}$ is proportional to rpm rate N, taking into consideration a proportionality constant κ which is empirical and easy to determine in advance by measurement. The following applies:

$$N = \kappa \cdot U_{ind} \text{ and}$$

$$U_{ind} = U_{kl} - (R_A \cdot I_A).$$

This described procedure provides the option, controlled by a microcontroller, of averaging over a fixed number of commutation ripples. Furthermore, the value range of an 8-bit analog-digital converter can be increased by interrupting integration numerous times and by adding the individual results of integration. This is advantageous because the dynamic range of measurement is very great due to potential fluctuations in the electrical system of the vehicle between 9 and 15 volts as well as the considerable variation in motor speed involved.

A microcontroller can be used for the sequencing and control of the measurement and evaluation process. Measured armature current values are for purposes of expediency stored in a memory store, preferably a ring buffer memory store. The oldest measured value within the ring buffer is overwritten with the latest measured value. Averaging occurs via summation of all measured values within the ring buffer and division of the obtained sums by the number of measured values. At moments predetermined by the microcontroller, the current averaged in this manner and the latest vehicle electric system voltage level are measured.

From the measured values the temperature value of the motor or of the motor armature is determined from determined temperature-dependent armature resistance $R_A$, in particular with the aid of the microcontroller. Furthermore, the voltage $U_{ind}$ induced in the armature expressed as the difference between the voltage $U_{bat}$ applied at the motor terminals and the product of the armature current $I_A$ by armature resistance $R_A$, is determined from the measured current and voltage values, with a determination also being made of the instantaneous rpm rate and/or any occurring change in the rpm rate.

Thus, the invention provides an advantageous solution for the indirect determination of the temperature of a direct current motor as well as for the indirect determination of the rpm rate of the motor.

What is claimed is:

1. An apparatus for determining a temperature of an armature of a direct current motor, comprising:

means for determining a temperature-dependent armature resistance as a quotient of an instantaneous voltage and a blocking current of the armature; and means for determining the temperature based on the armature resistance;

wherein the instantaneous voltage is applied and measured at terminals of the direct current motor, and wherein the armature resistance has a predetermined relationship to the temperature.

2. The apparatus according to claim 1, wherein the blocking current is determined by extrapolating an armature current measured at a predetermined time.

3. The apparatus according to claim 2, further comprising:

a shunt resistor for measuring the armature current; and an analog-digital converter for amplifying and digitizing the armature current into a current signal.

4. The apparatus according to claim 3, further comprising:

an integrator for averaging the current signal with a predetermined integration time; and a microcontroller for controlling the integrator.

5. The apparatus according to claim 4, further comprising a storage device for storing a digitized determined value when an integration of the current signal is interrupted by exceeding a threshold, wherein a new integration of the current signal begins and is repeated until the predetermined integration time has elapsed.

6. The apparatus according to claim 3, wherein the current signal is integrated via a plurality of commutation periods.

7. The apparatus according to claim 1, wherein the means for determining the armature resistance determines one of an rpm rate of the direct current motor and variations in the rpm rate of the direct current motor.

8. The arrangement according to claim 7, wherein the rpm rate of the direct current motor is determined in the following manner:

$$N = \kappa \cdot U_{ind}$$

wherein N is the rpm rate of the direct current motor, wherein κ is a motor-typical proportionality constant, and wherein $U_{ind}$ is a voltage induced in the armature which is a difference between the instantaneous voltage and a product of an armature current and the armature resistance.

9. An apparatus for determining a temperature of an armature of a direct current motor, comprising:

means for applying a voltage to terminals of the direct current motor;

means for measuring the voltage at the terminals of the direct current motor and a current of the armature;

means for integrating the current of the armature using a predetermined integration time to provide an integrated armature current;

means for determining a temperature-dependent armature resistance as a quotient of the voltage applied and measured at the terminals of the direct current motor and the integrated armature current; and means for determining the temperature based on the armature resistance, wherein the armature resistance has a predetermined relationship to the temperature of the armature of the direct current motor.

10. The apparatus according to claim 9, further comprising:

means for interrupting the means for integrating when a specific value is reached; and means for digitizing the integrated armature current and for providing thq digitized integrated armature current to the means for determining when the means for integrating is interrupted when the specific value is reached.

11. The apparatus according to claim 10, wherein the specific value is a given voltage value of the means for integrating.

12. The apparatus according to claim 11, further comprising means for subtracting an elapsed integration time from the predetermined integration time.

13. The apparatus according to claim 12, further comprising means for operating the means for integrating more than once and for adding each of the integrated armature currents until the predetermined integration time has elapsed.

* * * * *

UNITED STATES PATENT AND TRADEMARK OFFICE
CERTIFICATE OF CORRECTION

PATENT NO.   : 6,111,330
DATED        : August 29, 2000
INVENTOR(S)  : Lochmahr et al.

Page 1 of 1

It is certified that error appears in the above-identified patent and that said Letters Patent is hereby corrected as shown below:

Abstract,
Line 11, change "... arrangement,..." to -- arrangement --.
Line 17, change "... N=k $U_{ind'}$..." to -- N=k•$U_{ind'}$ --.

Column 1,
Line 49, change "... invention ..." to -- invention, --.

Column 2,
Line 27, change "...to ..." to -- $t_o$ --.

Column 6,
Line 2, change "...thq ..." to -- the --.

Signed and Sealed this

Sixteenth Day of October, 2001

Attest:

NICHOLAS P. GODICI
*Acting Director of the United States Patent and Trademark Office*

*Attesting Officer*